United States Patent [19]

Chambaere et al.

[11] Patent Number: 4,978,586

[45] Date of Patent: Dec. 18, 1990

[54] STEEL SUBSTRATE WITH METAL COATINGS FOR THE REINFORCEMENT OF VULCANIZABLE ELASTOMERS

[75] Inventors: Daniël Chambaere, Copley, Ohio; Wilfred Coppens, Kortrijk-Marke, Belgium; Hugo Lievens, Gent, Belgium; Roger De Gryse, Oosterzele, Belgium; Robert Hoogewijs, De Pinte, Belgium; Joost Vennik, Aalter, Belgium; Lucien Fiermans, Gent, Belgium

[73] Assignee: N. V. Bekaert S.A., Zwevegem, Belgium

[21] Appl. No.: 257,562

[22] Filed: Oct. 14, 1988

[30] Foreign Application Priority Data

Oct. 22, 1987 [BE] Belgium ............................ 8701204

[51] Int. Cl.$^5$ ............................................ B32B 15/06
[52] U.S. Cl. .................................. 428/625; 428/621; 428/629; 428/632; 428/675; 428/677
[58] Field of Search ............... 428/625, 632, 629, 621, 428/677, 675; 152/451

[56] References Cited

U.S. PATENT DOCUMENTS

| 2,120,738 | 6/1938 | Domm ................................ 428/625 |
| 2,296,838 | 9/1942 | Domm ................................ 428/625 |
| 2,884,161 | 4/1959 | Hurd et al. .............................. 220/63 |
| 3,858,635 | 1/1975 | Nakamoto et al. ................. 152/451 |
| 4,300,957 | 11/1981 | Marencak et al. ................. 148/6.31 |
| 4,333,785 | 6/1982 | Erickson ............................. 152/451 |
| 4,347,290 | 8/1982 | Haemers ............................ 152/451 |
| 4,645,718 | 2/1987 | Dambre .............................. 428/625 |
| 4,683,175 | 7/1987 | Bakewell et al. .................... 428/677 |
| 4,704,337 | 11/1987 | Coppens et al. ................... 428/677 |

| 4,828,000 | 5/1989 | Lievens et al. ...................... 428/625 |

FOREIGN PATENT DOCUMENTS

| 0188036 | 7/1986 | European Pat. Off. . |
| 0207999 | 1/1987 | European Pat. Off. . |
| 0230071 | 7/1987 | European Pat. Off. . |
| 2171999 | of 0000 | France . |
| 803836 | 10/1936 | France . |
| 63-105039 | 5/1988 | Japan . |
| 2076320 | 12/1981 | United Kingdom . |

OTHER PUBLICATIONS

W. J. van Ooij, "Fundamental Aspects of Rubber Adhesion to Brass-Plated Steel Tire Cords", 346 Rubber Chem. and Techn., vol. 52, No. 3, (1979), pp. 605–622.
Patent Abstracts of Japan, vol. 11, No. 53, (C–404), [2500], Feb. 19, 1987.
Patent Abstracts of Japan, vol. 5, No. 89, (C–58), [761], Jun. 10, 1981.

*Primary Examiner*—John J. Zimmerman
*Attorney, Agent, or Firm*—Nixon & Vanderhye

[57] ABSTRACT

The invention relates to a steel substrate with metal coatings for the reinforcement of vulcanizable elastomers, as well as a method for the continuous manufacture of a thus coated substrate and elastomer objects reinforced with said substrate.

The substrate is provided with a first coating and a second coating at least covering part of the first one and a bonding layer being present between the two said coatings. The second coating comprises e.g. cobalt that can be applied by plasma sputtering. The coating combination can be easily adapted to the specific elastomer compositions and the reinforcement requirements aimed at.

15 Claims, 4 Drawing Sheets

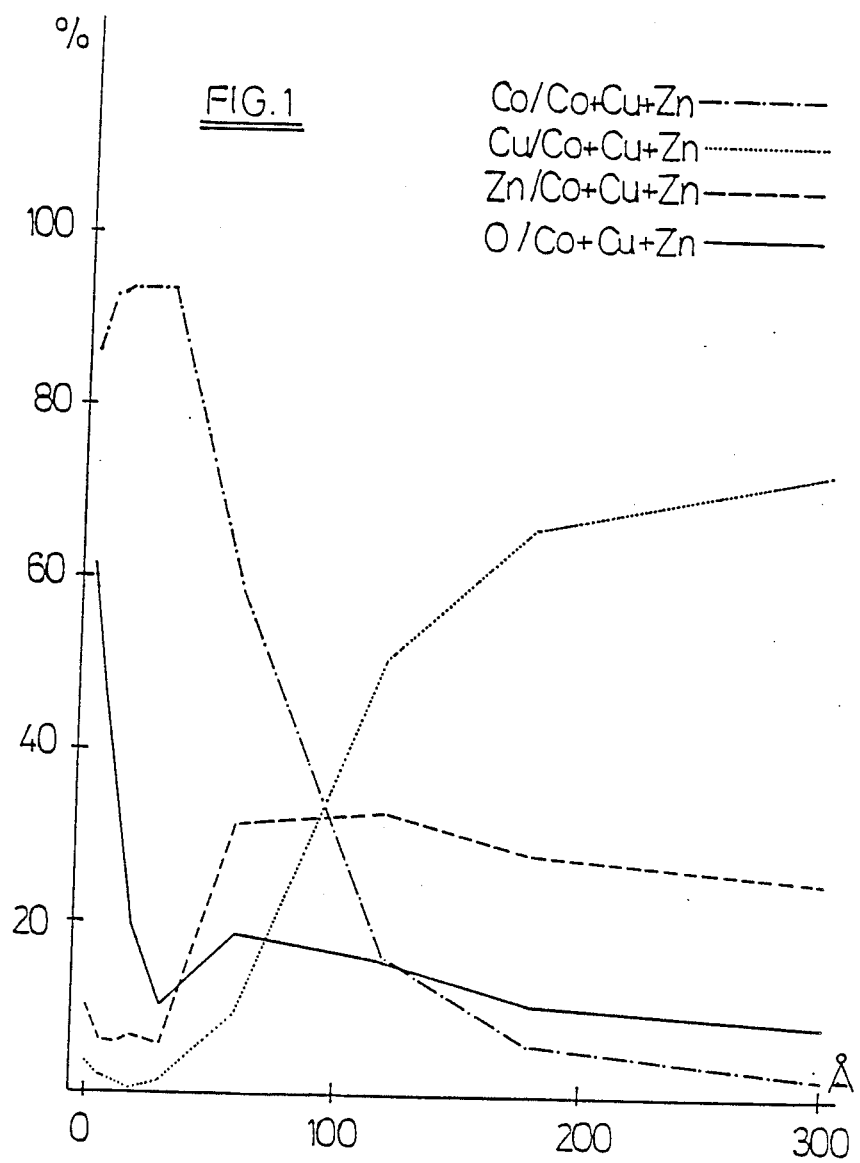

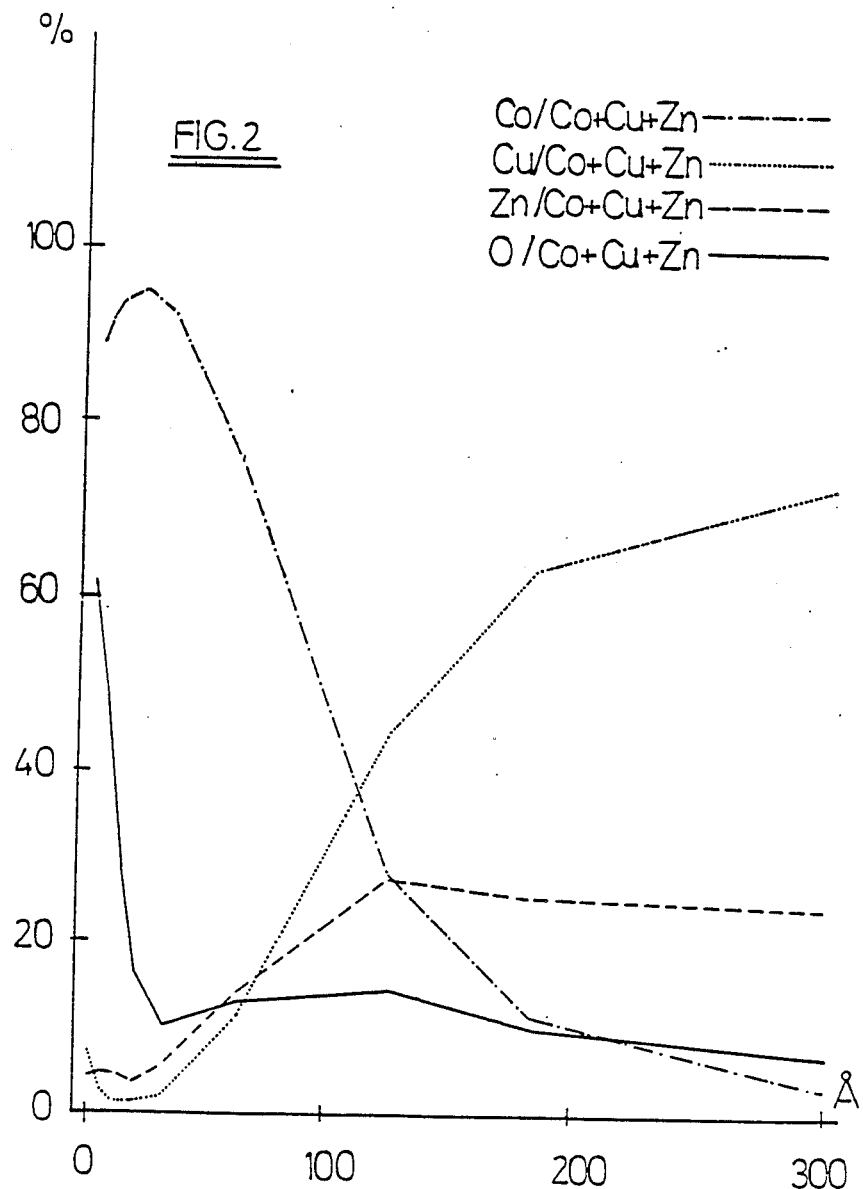

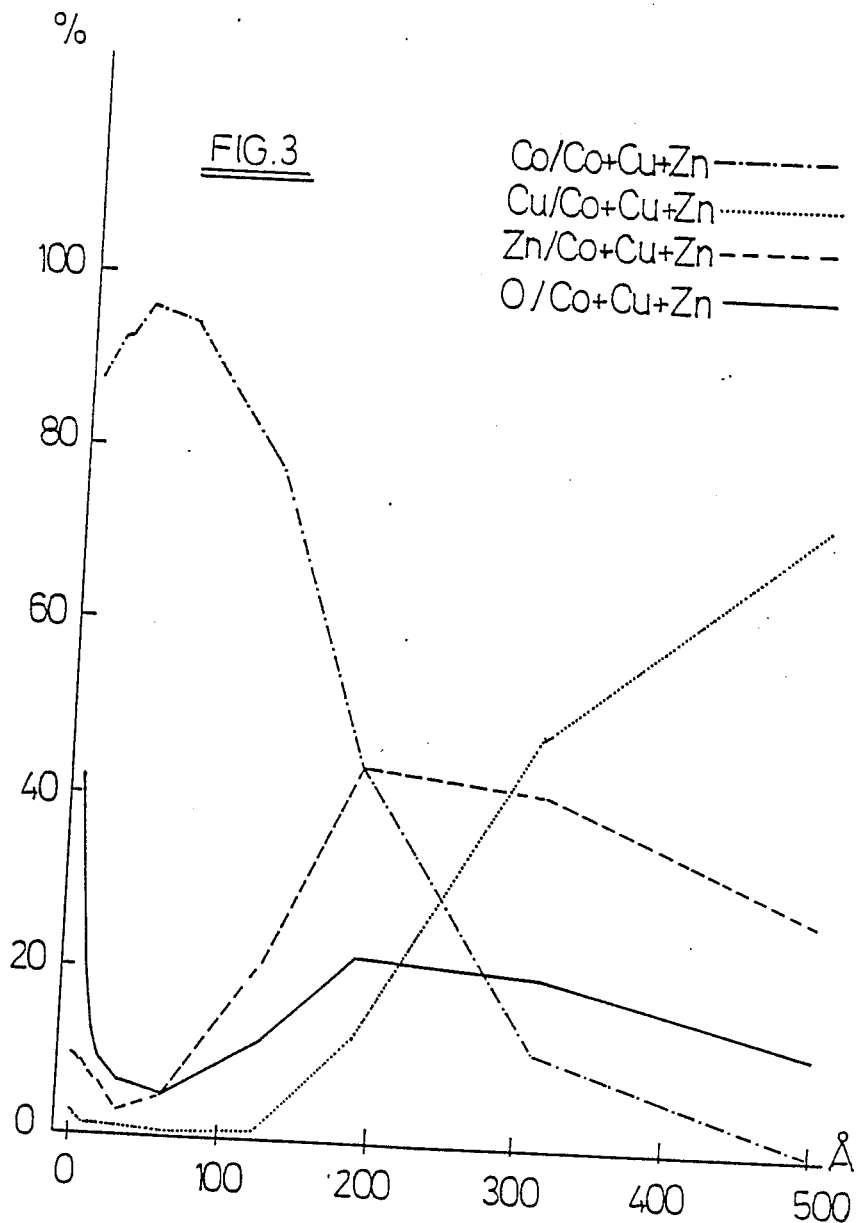

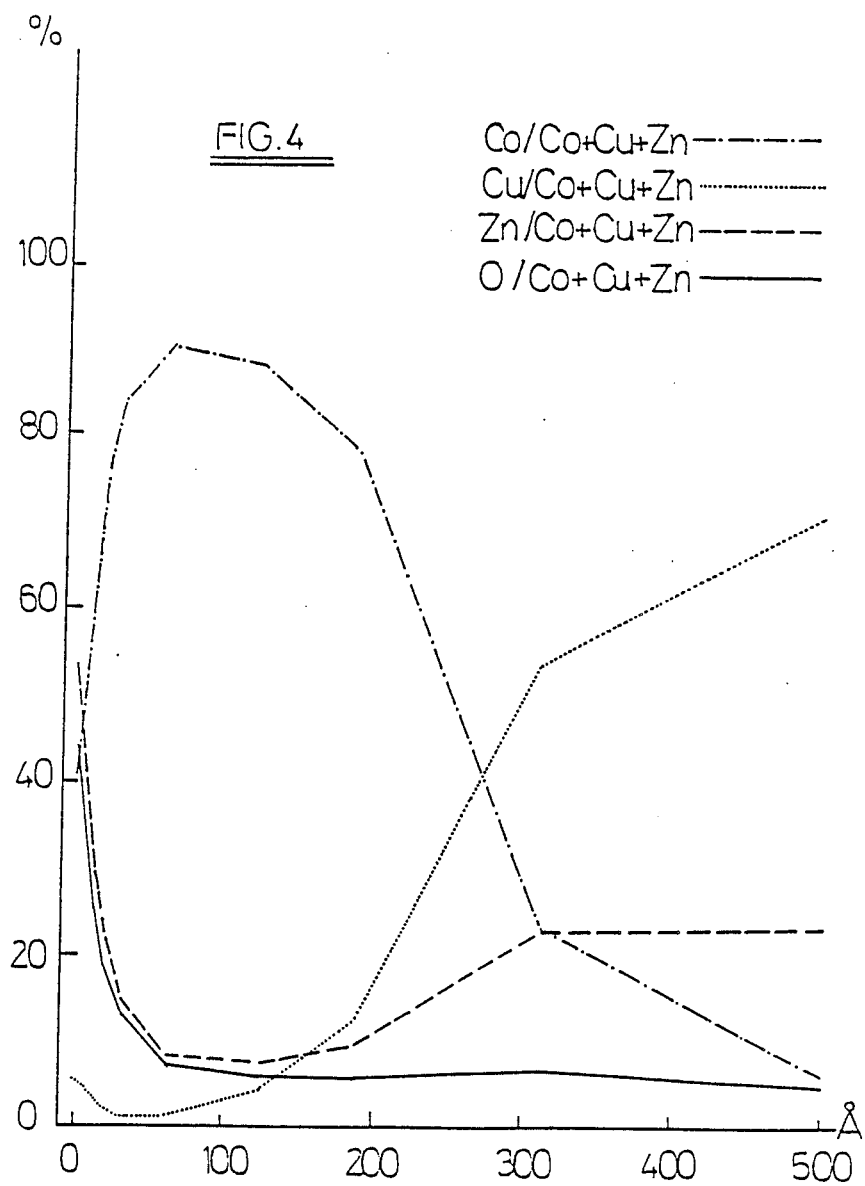

STEEL SUBSTRATE WITH METAL COATINGS FOR THE REINFORCEMENT OF VULCANIZABLE ELASTOMERS

FIELD OF THE INVENTION

The invention relates to a steel substrate with metal coatings for the reinforcement of vulcanisable elastomers such as rubber. The substrates can be wires, cords, sheets, laths or profiles, preferably of high-carbon steel or structures made up thereof such as wire nettings or fabrics. Thus reinforced elastomer products are e.g. vehicle tyres, rubber hoses, conveyor belts and transmission belts. The invention also comprises the elastomer products reinforced with the metal-coated steel substrate as well as a method to manufacture the thus coated steel substrates.

BACKGROUND AND SUMMARY OF THE INVENTION

It is known to coat steel wires with brass to promote adhesion to rubber. To improve and for the purpose of maintaining this adhesion under severe operating conditions, i.e. e.g. in humid conditions and/or at elevated temperature it has already been proposed to deposit a second metal coating, e.g. cobalt, on this brass coating as first metal coating. This measure is known from British Pat. application No. 2 076 320 A. It is also mentioned in this patent application that a cobalt coating has among other things a limited bonding affinity for brass. In order to attain a good bond between the two metal coatings it is then proposed to draw the coated object so that the cobalt diffuses into the brass surface. Apart from the fact that this method for applying the second coating still requires an additional drawing operation, cobalt is relatively hard to deform by drawing. Also, there is a risk of excessive diffusion of zinc from the brass into the cobalt, which causes the adhesion behaviour to decrease.

There is, however, an increasing need to provide the reinforcing elements with coatings with specific predetermined compositions according to i.e. the required durable adhesion with respect to special rubbers, e.g. rubbers with low sulphur content, fast vulcanising rubbers, etc. These elastomer compositions are constantly evolving so that there has arisen a need for flexibility for the bond between steel substrate and rubber via specific and relatively easy to apply intermediate layer systems. More in particular, there is a need for flexibility for adhesion layer and corrosion protection layer systems for the reinforcing substrates. A coating composition of two metal layers offers ample possibilities in this respect provided a good adhesion can be realised between first and second metal coating without adversely affecting the specific chosen layer compositions.

So, the object of the invention is, among other things, to provide steel substrates for the reinforcement of elastomers and provided with a first and a second metal coating, the intended and intrinsically present properties of first and second coating at least being maintained and at the same time a good and durable bond being guaranteed between the two coatings.

This objective is now met in accordance with the invention by providing a bonding layer between first and second metal coating that effects a durable adhesion between first and second coating, this second coating at least covering part of the first coating. As opposed to the cobalt/brass diffusion interface layer formed in accordance with British Pat. application No. 2 076 320 A the said bonding layer in accordance with the invention will comprise at least one nonmetallic component that, among other things, substantially contributes to the bond between the two metal coatings. In particular, this bonding layer can refrain the diffusion of the metals of the one coating into the adjacent coating when applying the second coating or during bonding to elastomers through vulcanisation. Also, this measure allows to dispense with the relatively difficult deformation operation afterwards, e.g. when cobalt is applied as second coating as in Pat. No. GB 2 076 320 A.

The first metal coating may consist of copper, zinc, nickel, tin, iron, chromium, manganese or alloys thereof, or else alloys thereof with cobalt, molybdenum, vanadium, titanium or zirconium. It may be intended to promote the adhesion of the steel substrate to vulcanisable elastomers. It may, possibly at the same time, be intended as corrosion-protection layer or frictional-resistance reducing coating or wear-resistant layer. A very common adhesion promoting coating is brass with in total between 58%–70% by weight of copper and the remainder being zinc. However, the copper content at the brass-layer surface will preferably be much lower, e.g. corresponding to a (Cu/Cu+Zn)-ratio not exceeding 20% when Cu and Zn are expressed in at.%.

The second metal coating may comprise one or more of the elements nickel, tin, iron, chromium, manganese, molybdenum or cobalt. It may among other things be intended to enhance the adhesion of the steel substrate, in particular the durability of the adhesion in critical operating conditions, as for cobalt. It may fulfil other functions as well, such as e.g. those enumerated hereinbefore in connection with the first coating.

A nonmetallic component of the bonding layer may be oxygen but also phosphor or nitrogen. Oxygen will be a preferred component for certain specified first and second coating types. Here, the bound oxygen may occur as oxide. In particular, it may occur as metal oxide in the bonding layer e.g. as oxide of a metal of the first coating. When e.g. brass is applied first metal coating a bonding layer mainly consisting of zinc oxide will effect a good bonding affinity for a secondcoating of cobalt, particularly when the (Cu/Cu+Zn)-ratio at the brass surface is relatively low. Preferably, the absolute copper content at the surface of the bonding layer will be less than 25 at.%. In other cases, titaniumnitride may be suitable as bonding layer. Obviously, the bonding layer may also fulfil other functions in addition to its inherent bonding function, e.g. increasing corrosion resistance, resistance to corrosion fatigue, ductility, wear resistance, etc.

A method for manufacturing the steel substrate coated in accordance with the invention basically comprises the application onto it of a first metal coating, followed by the application or the formation of a bonding layer on at least part of the first coating surface whereupon a second metal coating is applied onto the bonding layer Before applying or forming the bonding layer the substrate with the first coating may be subjected to a heat treatment and/or mechanical deformation operation to obtain a desired composition, thickness and structure However, after applying the second coating a thermomechanical consolidation treatment of the coatings with the intermediate bonding layer is no longer required, as opposed to what is known from British Pat. application No. 2 076 320 A.

Preferably, the method will be carried out in a continuous process. In particular, it has been found convenient to conduct a substrate, which has already been provided with the first metal coating with the desired composition, thickness and structure, through a coating installation in an continous process and to coat it there with the desired bonding layer and second metal coating. It will thereby be possible for the second coating to cover the bonding layer wholly or partly.

This continuous process can also be carried out in line for e.g. one or more parallel running substrates with a directlysucceeding bonding operation to a vulcanisable elastomer, e.g. by calendering and for the continuous reinforcement of the elastomer sheet. The feed-through speed in the coating installations must then of course be adapted to that of the calendering.

In particular, an oxidic bonding layer in accordance with the invention can be formed by suitably oxidising the substrate, provided with a first metal coating, in a way known in itself, either thermally to the air, or physically in a plasma or e.g. chemically. The bonding layer does not necessarily have to cover the total surface of the substrate, but basically only that part that has to be coated with the second coating afterwards. Sometimes it may even be appropriate to oxidise only that particular part when an oxide layer on the rest of the surface of the first coating would adversely affect the required properties of this surface, e.g. cause its adhesive capacity to decrease.

Basically, the second metal coating only needs to cover the part of the steel substrate that has to be very firmly and durably bonded to the elastomer afterwards. In the case of a steel cord, for instance, it is extremely important that the visible outside surface of the cord (i.e. of the outside or mantle filaments) have a good adhesive capacity. The adhesion of the elastomer to the core filaments is often less critical. Consequently, a common brass will usually suffice for the first metal coating.

The fact that a partial covering with a second coating is sufficient offers numerous advantages as will appear from the following description of an illustrative embodiment of the invention.

BRIEF DESCRIPTION OF THE ACCOMPANYING DRAWINGS

FIGS. 1 and 3 show a composition profile through the thickness of the two coatings with intermediate bonding layer in accordance with the invention.

FIGS. 2 and 4 represent by way of comparison a composition profile of the two coatings without a bonding layer in between.

DETAILED DESCRIPTION OF THE PREFERRED EMBODIMENTS

The steel substrate utilised as starting product is a steel cord for the reinforcement of rubber and made up of a number of steel filaments of high-carbon steel (0.7 to 1% by weight) with diameters of between 0.04 mm and 0.90 mm that are twisted together into a cord. The cords have a tensile strength situated between about 2 000 and 3 000 N/mm$^2$. The steel filaments are in the usual way provided with a first metal coating which may be a brass coating with a final thickness of between about 0.10 and 0.30 μm. As is known, the brass layer can be obtained by electrolytically coating the steel filaments with copper and then with zinc. Contiguously, a brass layer is formed by thermodiffusion, with an overall composition of between about 58% and 70% by weight of copper the remainder being zinc. The thus coated filament-shaped steel substrate is then reduced to the desired final diameter by wire drawing. After this, a number of thus coated filaments is twisted together into the desired cord structure.

Of this commonly known manufacturing method a number of variants are known for improving, among other things, the corrosion fatigue of the cord and/or the adhesion retention at elevated temperature and/or humidity. In this way, measures can be applied to improve the compactness and/or grain structure or reactivity of the brass coating, specifically as described in commonly-owned U.S. Pat. No. 4,645,718 and published European Pat. application No. 230 071. Apart from that, ternary alloy elements may be present in the brass coating (in addition to copper and zinc). Further, protective metal layers, e.g. of iron, zinc or nickel, chromium, manganese or alloys thereof may be present on the steel filament, i.e. underneath the brass coating. Also, a small quantity of phosphate ions may have been deposited onto the brass surface. According to another variant the brass-coated filament may have been cleaned in an inert plasma or thermally in vacuum in order to obtain e.g. a (Cu/Cu+Zn)-ratio at the brass surface of not more than 0.2 as commonly-owned U.S. Pat. No. 4,828,000.

As mentioned hereinbefore, an oxygen-containing bonding layer in accordance with the invention can be applied onto the brass-coated steel substrate by suitably oxidising the coated substrate. As zinc has a greater affinity for oxygen than copper the formed metal oxide layer will mainly consist of zinc oxide. Furthermore, this oxidation affinity promotes a diffusion of zinc to the brass surface so that the copper concentration is lowered there. The result is a low (Cu/Cu+Zn)-ratio at the brass surface, e.g. lower than 0.25 when Cu and Zn contents are expressed in at.%. The oxidation can e.g. be carried out by heating the cord in air for a short time or by a plasma treatment with oxygen as spray gas or in other words by sputtering the cord in an oxygen plasma. Prior to this oxidation, the substrate can, if desired, be cleaned thermally in vacuum or by so-called cold sputtering as described hereinbefore.

This allows to attain an even lower copper concentration at the outside surface of the bonding layer just before applying the second metal layer.

This zinc-oxide bonding layer constitutes a diffusion barrier between the brass and the second metal layer to be applied. The fact is, it was found that when applying a second metal layer onto an unoxidised brass surface the zinc readily diffuses from this surface into this second layer. Specifically, this diffusion may occur if the application of the second layer is effected at elevated temperature, as e.g. in the case of plasma coating and/or vulcanisation of the elastomer on the covered steel substrate. This way, the second metal layer is contaminated with zinc that has diffused into it, which generally causes adhesion to the first metal layer to decrease. On the other hand, the zinc atoms in a zinc-oxide bonding layer on the brass surface are anchored or blocked and diffusion to the second metal coating is strongly refrained even at elevated temperature.

Further, the simultaneous decrease of the copper concentration just below the bonding layer precludes—after bonding to the rubber—an excessive copper sulphide formation during vulcanisation or as a result of ageing. Excessive copper sulphide formation is pernicious to a durable adhesion. When e.g. cobalt is then applied as second coating, cobalt sulphide bridges to the elastomer will preferably be formed, which improves the adhesion behaviour. Cobalt is known as conducive to improving the adhesion durability under severe operating conditions. Consequently, the measures in accordance with the invention render it superfluous to apply cobalt salts in the elastomer composition. This way, cobalt consumption is kept down, for cobalt is expensive. Apart from that, cobalt-salt additions may adversely affect other rubber properties.

Because of the high price of e.g. cobalt it will always be the aim in practice to utilise as little of this metal as possible, in other words to apply very thin layers as second coating. Plasma sputtering is ideal for this. Here, the metal of the second coating constitutes the cathode. A suitable method and installation for continuous sputtering is described in U.S. Pat. No. 4,828,000 and in Pat. No. JP-A-63105039, the contents of which are considered included herewith by way of reference. However, a plasma coating technique inevitably involves heat generation with the known pernicious effect of zinc evaporation from the brass surface and zinc contamination of the cobalt layer. As explained hereinbefore, the application of a zinc oxide layer prevents this contamination.

Moreover, when applying the second metal coating onto a steel cord structure by plasma coating mainly the outside of the cord will be coated. This is necessary, but also sufficient to realise an optimum adhesion to the surrounding elastomer. However, this offers the additional advantage that a smaller quantity suffices than when steel filaments to be processed into cord would be covered with a second coating before being twisted together. In particular, this possibility is important for the expensive cobalt material as second coating. The covering with the second coating as final step in the cord manufacture just before winding or bonding to the rubber guarantees for the rest a clean and optimum surface condition of the cord for the benefit of later adhesion properties. It will always be recommended to keep the temperature of the steel substrate as low as possible e.g. lower than 100° C. during possible cleaning as well as during the oxidation treatment of the brass surface as well as during the application of the second metal coating. High temperatures may among other things occasion excessive oxidation and loss in tensile strength of the steel substrate. It has also been found that a considerable oxidation of the second coating surface, e.g. in the case of cobalt is detrimental to a good and durable adhesion in severe operating conditions. So, summing up it may be stated as an example that a steel substrate with the combination of brass with low copper concentration at its surface (first coating), zinc-oxide bonding layer, thin cobalt layer as second coating and a low cobalt-oxide content at the outside surface will be advantageous. FIG. 1 illustrates an evolution of the composition for this coating structure through the coating thickness. The cobalt concentration in the outside surface to a depth of about 40 Å is very high and then drops very rapidly. By thin cobalt coating is meant a coating thickness below 250 Å and preferably below 200 Å. Specifically, this means that the depth at which the cobalt content (Co/Co+Cu+Zn) drops below 50% must be smaller than 250 Å under the outside surface (i.e. depth of 0 Å) of the coating. FIGS. 1 and 2 show situations in which the cobalt layer is particularly thin: the cobalt content already drops below 50% from a depth of between 70–100 Å. The copper concentration is remarkably low near the outside surface. Apart from that, the zinc and oxygen peaks of the bonding layer are clearly perceptible at a depth of about 50–200 Å in FIG. 1.

These peaks are also visible in FIG. 3 at a depth of 150–300 Å. However, the cobalt layer is thicker there and in FIG. 4 it is in fact too thick already. Oxygen peaks are absent in FIGS. 2 and 4. However, the application by sputtering of the thick cobalt layer according to FIG. 4 and without zinc-oxide bonding layer clearly shows the zinc contamination in the cobalt outer layer. This is possibly due to too high a temperature rise during protracted sputtering (thick layer) as a result of which the plasma loads itself with zinc fumes if the zinc atoms have not been blocked beforehand in a zinc-oxide bonding layer.

The invention can also be applied to a steel cord fabric as substrate. Here, warp and weft elements will preferably consist of steel cords. The plasma chamber will then have slot-shaped feed-through elements for the fabric.

EXAMPLE:

A steel cord with construction $3+9\times 0.22+1$ and with a conventional brass coating on the filaments was coated with a thin cobalt layer by sputtering in an Argon spray gas with insertion of a zinc-oxide bonding layer. By way of comparison, a similar cord was in the same way coated with cobalt in a continuous process, but without inserting a bonding layer. Then, the two cord types were embedded in rubber and vulcanised. The adhesion behaviour of the rubber to the cords was checked in accordance with the classical ASTM-D-2229 test and compared.

The brass coatings had an overall composition of 63% by weight of copper and 37% by weight of zinc. The quantity of brass amounted to 3.85 g per kg of cord. The cord in accordance with the invention was then continuously heated in air for a short time by electric resistance heating, a zinc-oxide layer being formed at the brass surface. Here, the cord temperature must be prevented from rising too high, otherwise the tensile strength of the cord will decrease too much. An optimum degree of oxidation (i.e. without appreciable loss in tensile strength) amounts to the formation of approximately 20 to 55 mg of ZnO per $m^2$ of brass surface (preferably 35–50 mg/$m^2$). The brass layer can also be oxidised by conducting the cord through an oxygen plasma chamber. An intense cooling of this chamber is indicated to contain the rise in the temperature of the cord. With this method, too, it was found that hardly any losses in tensile strength occurred when forming a bonding layer of approximately 30 g/$m^2$ of ZnO (mainly on the outside surface of the cord).

Then, both the oxidised cord (FIG. 1) and the unoxidised cord as a reference (FIG. 2) were continuously coated as anode by sputtering (in Argon gas in vacuum) in a tubular chamber with a thin cobalt layer, i.e. with a cobalt quantity of 27–28 mg per kg of cord weight. It was found that a thick cobalt layer, i.e. with a weight of more than 65 mg/kg of cord or in other words a thickness of more than 200 Å, gives insufficient adhesion, particularly when the cords are bonded to fast vulcanising rubbers. The cord with coating profile according to FIG. 3 carried 53 mg of cobalt per kg of cord of the same $3+9\times 0.22+1$ type. The coating profile according to FIG. 4 refers to a cobalt coating of 127 mg/kg of cord of this type. As is known from Dutch Pat. application No. 86 02759 the tubular cobalt wall constitutes the cathode material. For the specific method and apparatus applied for this example we refer to this Dutch patent application. In particular, it has been found important to create a homogeneous magnetic field in the coating chamber. The feed-through speed through the chamber amounted to 1.2 m/min. The composition profiles of the coatings on the outside surface of the cords in accordance with this example are established via an Auger-analysis method of the coating structure.

The thus cobalt-coated cords were embedded in the usual way in a standard rubber mixture and vulcanised at 145° C. during 40 min. under a pressure of 500 N/cm$^2$.

When pulling the cord out of the rubber or when peeling the rubber off from the cord surface it was found that in the case of the cords without zinc-oxide bonding layer the cobalt layer was easily torn loose from the brass and remained stuck to the rubber. This did not occur in the case of the cords with zinc-oxide bonding layer in accordance with the invention. The separation from the elastomer occurred in the elastomer layer itself. Consequently, the cord in accordance with the invention had a good coverage degree, which is expressed as an appearance rating APR.

For a certain industrial rubber composition the cords oxidised through resistance heating had on average a better coverage degree (80-90%) than the cords oxidised via an oxygen plasma (±50%). This was also the case for a number of experimental rubber compositions both for the ones with low sulphur content and for the ones with high sulphur content. Moreover, the addition of Cyrex to these rubbers mostly had a favourable effect on the appearance rating.

Finally, the invention relates to objects of elastomer material such as e.g. elastomer sheets and strips that comprise at least one and mostly several parallel running steel substrates, particularly steel cords as described hereinbefore. These cords or sheets can e.g. be used to reinforce the tread of vehicle tyres. They can be wound as reinforcing layers in the wall of elastomer hoses or serve as longitudinal and/or cross reinforcement in conveyor belts.

We claim:

1. A steel substrate for the reinforcement of elastomers, said steel substrate having first and second metal coating layers, wherein the second layer covers at least a part of the first layer, and wherein a bonding layer is present between the first and second layers and comprises at least one nonmetallic component, said bonding layer having a weight of 20 to 55 mg per m$^2$ of surface of said first layer.

2. Steel substrate in accordance with claim 1 characterised in that at least one nonmetallic component of the bonding layer is oxygen.

3. Steel substrate in accordance with claim 2 characterised in that the bonding layer is an oxide.

4. Steel substrate in accordance with claim 3 characterised in that the oxide is a metal oxide.

5. Steel substrate in accordance with claim 4 characterised in that it is an oxide of a metal of the first coating.

6. Steel substrate in accordance with claim 1 characterised in that the first metal coating layer is brass with in total 58-70% by weight of copper and the remainder being zinc.

7. Steel substrate in accordance with claim 6 characterised in that the brass coating has at its surface a (Cu/Cu+Zn)-ratio of not more than 20%.

8. Steel substrate in accordance with claim 7 characterised in that in absolute terms less than 25 at.% of Cu is present at the surface of the bonding layer.

9. Steel substrate in accordance with any one of the preceding claims characterised in that the second metal coating consists of cobalt.

10. Steel substrate in accordance with claim 9 characterised in that the bonding layer mainly consists of zinc oxide.

11. Steel substrate in accordance with claim 1 in the form of a steel cord characterised in that the second metal coating covers the outside of the cord only.

12. Steel substrate in accordance with claim 1 in the form of a steel cord fabric having warp and weft components, and wherein the steel cords constitute at least one of the warp and weft components.

13. A composite elastomeric article reinforced with at least one steel substrate in accordance with claim 1.

14. A composite elastomeric article in accordance with claim 13, wherein the substrate is a steel cord.

15. A composite elastomeric article in accordance with claim 13 or 14, in the form of an elastomeric sheet having a number of parallel running substrates embedded therein.

* * * * *